United States Patent [19]
Tseng

[11] Patent Number: 5,677,218
[45] Date of Patent: Oct. 14, 1997

[54] METHOD OF FABRICATING FET DEVICE WITH NARROW GATE LENGTH

[75] Inventor: Horng-Huei Tseng, Hsinchu, Taiwan

[73] Assignee: Vanguard International Semiconductor Corp., Hsinchu, Taiwan

[21] Appl. No.: 712,149

[22] Filed: Sep. 11, 1996

[51] Int. Cl.[6] .................................................. H01L 21/265
[52] U.S. Cl. ............................................ 437/45; 437/186
[58] Field of Search .......................... 437/44–45, 41, 437/186

[56] References Cited

U.S. PATENT DOCUMENTS

| 5,374,575 | 12/1994 | Kim et al. | 437/44 |
| 5,399,508 | 3/1995 | Nowak | 437/27 |
| 5,434,093 | 7/1995 | Chau et al. | 437/41 |
| 5,472,897 | 12/1995 | Hsu et al. | 437/44 |
| 5,484,743 | 1/1996 | Ko et al. | 437/44 |
| 5,534,447 | 7/1996 | Hong | 437/27 |
| 5,538,913 | 7/1996 | Hong | 437/44 |

OTHER PUBLICATIONS

Ghandhi, "VLSI Fabrication Principles Silicon and Gallium Arsenide", p. 524, John Wiley and Sons 1983.

*Primary Examiner*—Jey Tsai
*Assistant Examiner*—Richard A. Booth
*Attorney, Agent, or Firm*—Christensen, O'Connor, Johnson & Kindness, PLLC

[57] ABSTRACT

The present invention relates to a method of forming a local threshold voltage ion implantation to reduce the junction capacitance in a semiconductor device. A polysilicon layer is formed over the device. A first dielectric layer is formed on the polysilicon layer. Then an opening is formed in the polysilicon layer by using patterning and etching. Subsequently, a second dielectric layer is formed on the first dielectric layer. An etching step is used to formed sidewall spacers on the inner sidewalls of the opening. Then an ion implantation is performed by using said first dielectric layer and sidewall spacers as a mask.

11 Claims, 2 Drawing Sheets

METHOD OF FABRICATING FET DEVICE WITH NARROW GATE LENGTH

FIELD OF THE INVENTION

The present invention relates to a method of fabricating a MOSFET, and more specifically, to a method of forming a MOSFET having a narrow gate length.

BACKGROUND OF THE INVENTION

In many MOS IC applications, it is critical to be able to establish and maintain a uniform and stable value of threshold voltage (Vt). Vt is determined by connecting the drain and gate of the MOSFET together and measuring the drain current as a function of gate voltage.

Vt is normally adjusted by implanting a thin layer of impurities (boron or arsenic) at the Si surface. See *Silicon Processing for the VLSI Era, Vol. 1—Process Technology*, S. Wolf and R. N. Tauber, Lattice Press, 1986, p. 325. A typical value of Vt in NMOSFETs is 0.7 V. One parameter that impacts Vt is the work function difference between the gate and the semiconductor substrate. See *Modular Series on Solid State Devices, Vol. IV*, R. F. Pierret et al., Addison-Wesley Publishing, 1983, pp. 59–64. While the work function of the gate is constant, the work function of the substrate depends on the substrate doping. Thus, changes in the substrate doping concentration produce changes in Vt. Merely increasing the substrate doping, however, is not desirable because it will adversely impact other MOSFET characteristics, such as lowering the junction-breakdown voltage and enlarge junction capacitances.

Prior to the development of ion implantation in the early 1970s, adjustment of the substrate doping was the only practical processing approach for significantly controlling the Vt in active devices (see *Silicon Processing for the VLSI Era, Vol. 1—Process Technology*, S. Wolf and R. N. Tauber, Lattice Press, 1986). Ion implantation can be used either to increase or decrease the net dopant concentration at the silicon surface. As a result, substrate doping can be selected on the basis of optimum device performance since Vt can now be set by the Vt adjustment implant process.

It has further been the trend in integrated circuit technology to increase the density of semiconductor devices per unit area of silicon wafer. It follows then that the semiconductor devices, such as transistors and capacitors, must be made smaller and smaller. However, one area which poses as a significant barrier to the miniaturization of semiconductor devices is photolithography. In particular, the problem of "registration" accuracy arises. Registration refers to the aligning of a mask to the semiconductor wafer to ensure that the mask is correctly positioned atop the features of the wafer. For a further discussion of registration, the reader is invited to review *Silicon Processing for the VLSI Era, Vol. 1—Process Technology*, S. Wolf and R. N. Tauber, Lattice Press, 1986, pp. 473–476.

Furthermore, as the dimension of the gate is reduced, the threshold voltage of the MOSFETs become less well predicted by the long channel Vt. It has been found that Vt is decreased when the gate length is decreased. In other words, the threshold voltage will shift in short channel MOSFETs. The decrease of Vt with the gate dimension in short channel devices is crucial because enhancement-mode FETs in CMOS are generally designed to operate with Vt of 0.6–0.8V. If the magnitude of Vt drops even slightly below its designed value, the device may exhibit excessive drain leakage current.

If short channel effects reduce Vt below the long channel values, the channel doping concentration must be increased to reestablish the desired Vt. Higher channel doping, however, generally degrades other device characteristics, such as junction capacitance and saturation characteristics.

Thus, there are significant problems in fabricating narrow channel MOSFETs that have a Vt that can be easily controlled while maintaining performance characteristics. The present invention solves these and other problems of the prior art.

SUMMARY OF THE INVENTION

A method of forming a gate of a MOS transistor on a semiconductor substrate is disclosed. A method of forming a gate of a MOS transistor in a semiconductor substrate is disclosed. The method comprises the steps of forming a gate oxide layer on said semiconductor substrate; forming a polysilicon layer on said gate oxide layer; forming a first dielectric layer on said polysilicon layer; patterning and etching said first dielectric layer to form an opening in said first dielectric layer; forming sidewall spacers on the inner sidewalls of said opening; performing a local threshold voltage implant by using said first dielectric layer and said sidewall spacers as a implant mask to implant ions into said substrate; oxidizing said polysilicon layer in said opening into a polysilicon-oxide layer; removing said first dielectric layer and said sidewall spacers; and etching said polysilicon layer to form a gate by using said polysilicon-oxide layer as an etching mask.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In the present invention, a new method is disclosed to form a deep submicron MOSFET with a narrow gate smaller than that of the photolithography limitation. The formation of the present invention includes many process steps that are well known in the art. For example, the process of photolithography masking and etching is used extensively herein.

This process consists of creating a photolithography mask containing the pattern of the component to be formed, coating the wafer with a light sensitive material known as a photoresist, exposing the photoresist coated wafer to ultraviolet light through the mask to soften or harden parts of the photoresist (depending on whether positive or negative photoresist is used), removing the softened parts of the photoresist, etching to remove the materials left unprotected by the photoresist and stripping the remaining photoresist. This photolithography masking and etching process are referred to as "patterning and etching." Additionally, it should be pointed out that the method described herein includes many conventional process steps that are well known in the art. Each of these steps are conventional and will not be described in detail herein.

Figure 1:
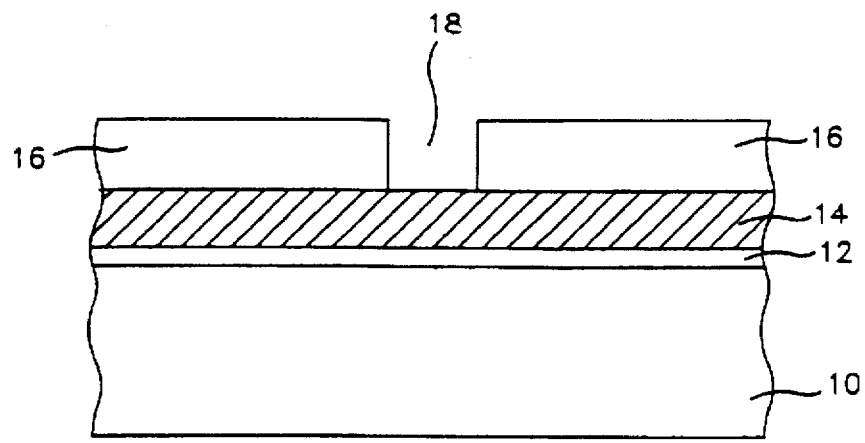
FIG. 1 is a cross section view of a semiconductor wafer illustrating the step of forming a gate oxide layer, a polysilicon layer, a first nitride layer and forming an opening in the nitride layer in accordance with the present invention.

Turning to FIG. 1, a single crystal substrate 10 is used. Preferably, the single crystal substrate 10 is P-type with a <100> crystallographic orientation. A thick field oxide region, FOX, (not shown) is created for the purposes of isolation. Generally speaking, the FOX region is created via photolithography and dry etching to etch a silicon nitride-silicon dioxide composite layer. After the photoresist is removed and wet cleaned, a thermal oxidation in an oxygen-steam ambient is used to form the FOX region, to a thickness of about 3000–6000 angstroms.

Initially, a first dielectric layer 12 is created atop the substrate 10 to act as the gate oxide 12. In the preferred embodiment, the first dielectric layer is composed of silicon dioxide which is formed by using an oxygen-steam ambient, at a temperature of between about 850° to 1000° C. Alternatively, the gate oxide 12 may be formed using other known oxide chemical compositions and procedures. As is known in the art, by controlling the pressure and time at which the oxygen-steam ambient is exposed to the substrate, the thickness of the silicon dioxide layer 12 can be easily controlled. In the preferred embodiment, the thickness of the silicon dioxide layer 12 is approximately 50–200 angstroms.

Still referring to FIG. 1, after the first silicon dioxide layer 12 is formed, a polysilicon layer 14 is formed over the silicon dioxide layer 12. In the preferred embodiment, the polysilicon layer 14 is formed by using conventional chemical vapor deposition (CVD) to have a thickness about 2000–4000 angstroms. As will be seen below, the polysilicon layer 14 is used to form the gate of the MOSFET.

Next, a second dielectric layer 16 is deposited atop the polysilicon layer 14. The second dielectric layer 16 is preferably composed of nitride. The thickness of the nitride layer 16 is about 1000–2500 angstroms. Subsequently, patterning and etching steps are used to etch the nitride layer 16 to the surface of the polysilicon layer 14. An opening 18 is formed in the nitride layer 16. In this embodiment, the dimension of the opening 18 is about 0.4–0.5 micrometers.

Figure 2:
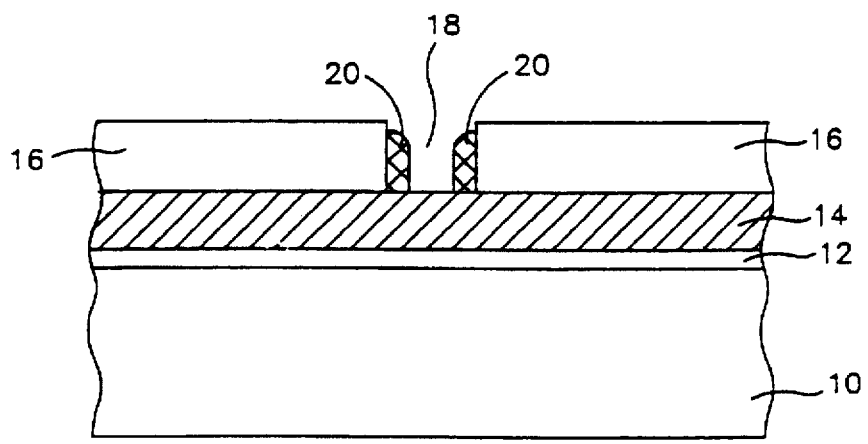
FIG. 2 is a cross section view of a semiconductor wafer illustrating the step of forming sidewall spacers in the inner sidewalls of the opening in accordance with the present invention.

Turning to FIG. 2, a third dielectric layer is formed on the second dielectric layer 16 and along the surface of the opening 18. Then an anisotropic etching step is performed to etch the third dielectric layer. Sidewall spacers 20 are created on the inner sidewalls of the second dielectric layer 16 by the etching. The opening 18 has a dimension after the etching beyond the photolithography limitation. In other words, by "squeezing" the opening 18 by the formation of sidewall-spacers 20, the opening 18 is narrowed. To further explain, assume that the opening size is 0.5 microns. Assume further that the sidewall spacers 20 are each 0.15 microns, respectively. By adding the sidewall spacers 20, the opening 18 is narrowed by, for example, 0.3 microns (0.15 microns on both sides of opening 18). Thus, the opening 18 is now 0.2 microns in width.

Figure 3:
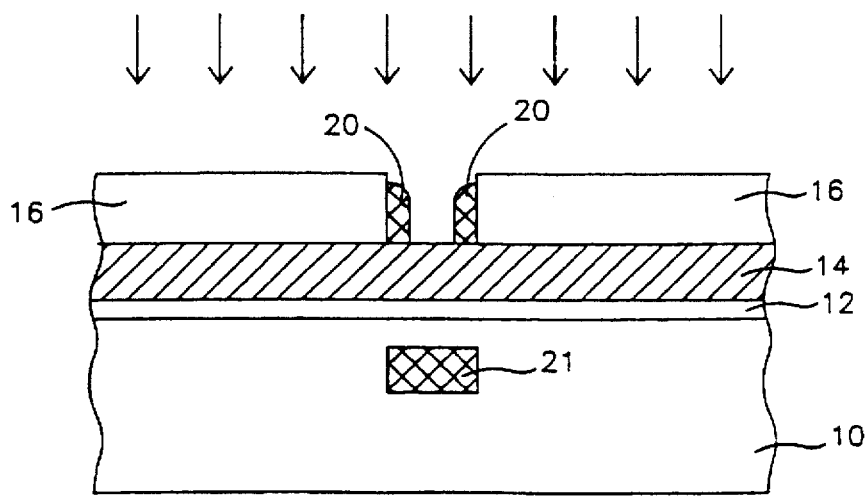
FIG. 3 is a cross section view of a semiconductor wafer illustrating the step of doping ions to adjust a threshold voltage in accordance with the present invention.

Turning to FIG. 3, an ion implantation step is performed to adjust the threshold voltage by using the nitride layer 16 and the sidewall spacers 20 as a doping mask. A local ion implant region 21 is formed to reduce the junction capacitance of the device. In preferred embodiment, the dosage of the ion implant is about the range of 1E13–1E14 atom/cm$^2$. The energy of the ion implant is about the range of 40–80 eV.

Figure 4:
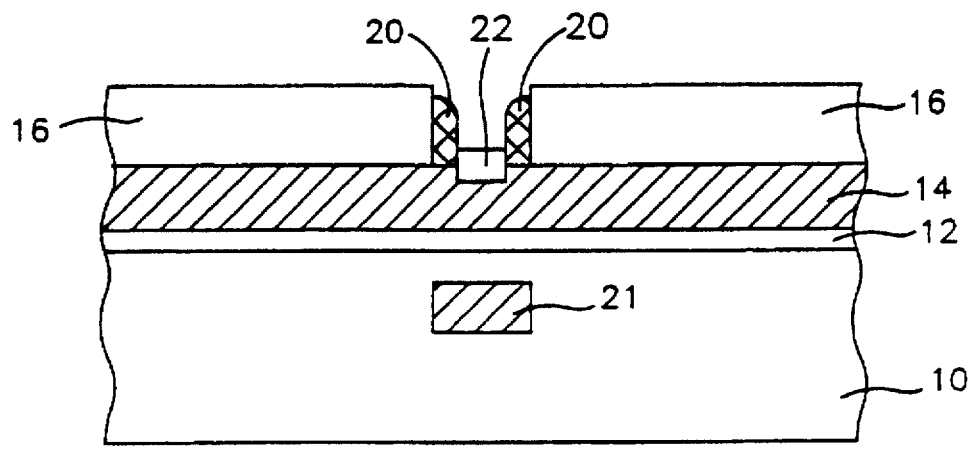
FIG. 4 is a cross section view of a semiconductor wafer illustrating the step of oxidizing the polysilicon in the opening in accordance with the present invention.

Turning to FIG. 4, a thermal oxidation step is performed to oxidize the polysilicon layer 14 which is exposed by the opening 18. The oxidation process expands the volume of the exposed polysilicon layer 14. Further, the exposed polysilicon layer 14 is transformed into a polysilicon-oxide layer 22 by the oxidation process. In the preferred embodiment, the thermal oxidation step is performed in an oxygen-steam ambient, at a temperature between about 850° to 1000° C.

Figure 5:
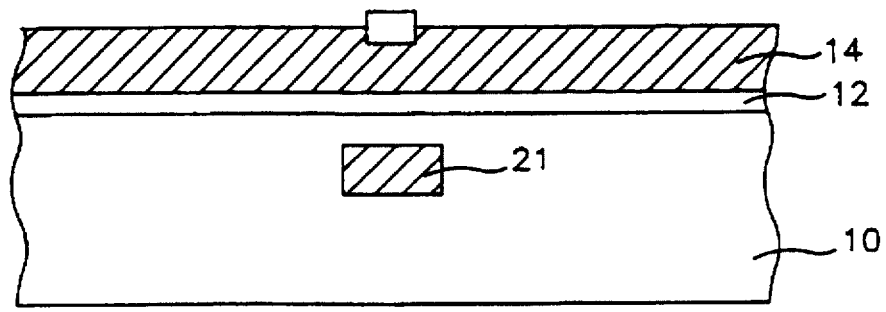
FIG. 5 is a cross section view of a semiconductor wafer illustrating the step of removing the nitride layer and sidewall spacers in accordance with the present invention.

Referring to FIG. 5, the next step of the present invention is to remove the nitride layer 16 and the nitride sidewall spacers 20. Typically, the nitride can be removed by hot phosphorus acid solution ($H_3PO_4$). Any suitable etchant can be also used in this step.

Figure 6:
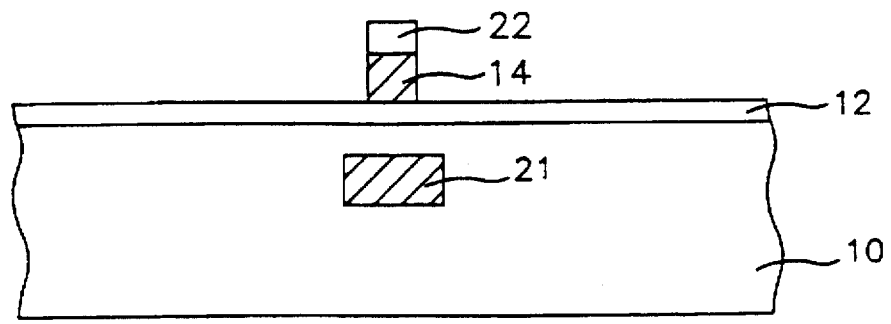
FIG. 6 is a cross section view of a semiconductor wafer illustrating the step of etching the polysilicon layer to form a gate structure in accordance with the present invention.

Referring to FIG. 6, the next step in the manufacturing process is to use the polysilicon-oxide 22 as an etching mask to etch the polysilicon layer 14. The polysilicon layer 14 is etched down to the surface of the gate oxide layer 12. In one embodiment, $SF_6$ can be used as the reaction gas because of its high etching selectivity between polysilicon and oxide.

Optionally, the gate oxide 12 is removed except under the polysilicon-oxide 22. Indeed, for further processing of the gate structure to form a MOSFET, the gate oxide is removed and ion implantation is done to form source and drain regions adjacent to the gate.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a gate of a MOS transistor in a semiconductor substrate, said method comprising the steps of:

forming a gate oxide layer on said semiconductor substrate;

forming a polysilicon layer on said gate oxide layer;

forming a first dielectric layer on said polysilicon layer;

patterning and etching said first dielectric layer to form an opening having inner sidewalls in said first dielectric layer;

forming sidewall spacers on the inner sidewalls of said opening to narrow said opening;

performing a local threshold voltage implant by using said first dielectric layer and said sidewall spacers as a implant mask to implant ions having a dose and energy into said substrate;

thermally oxidizing said polysilicon layer in said opening into a polysilicon-oxide layer, the width of said polysilicon-oxide layer being less than the width of said opening;

removing said first dielectric layer and said sidewall spacers; and etching said polysilicon layer to form a gate having a width the width of said gate being less than the width of said opening by using said polysilicon-oxide layer as an etching mask.

2. The method of claim 1 wherein said step of forming sidewall spacers includes the steps of forming a second dielectric layer on said first dielectric layer and along the surface of said opening and performing an anisotropic etching to etch said second dielectric layer.

3. The method of claim 1, wherein said first dielectric layer is composed of nitride.

4. The method of claim 3, wherein said nitride layer is formed to have a thickness of approximately 1000–2500 angstroms.

5. The method of claim 2, wherein said second dielectric layer is composed of nitride.

6. The method of claim 1, wherein said polysilicon layer is formed to have a thickness of approximately 2000–4000 angstroms.

7. The method of claim 1, wherein said thermal oxidation is performed in an oxygen-steam ambient, at a temperature between about 850° to 1000° C.

8. The method of claim 1, wherein the dosage of said local threshold implant is about the range of 1E13–1E14 atom/$cm^2$.

9. The method of claim 1, wherein the energy of said ion implant is about the range of 40–80 eV.

10. The method of claim 3, wherein said first dielectric layer is removed by using hot phosphorus acid solution ($H_3PO_4$).

11. The method of claim 5, wherein said sidewall spacers are removed by using hot phosphorus acid solution ($H_3PO_4$).

* * * * *